US006558882B2

(12) United States Patent
Koide

(10) Patent No.: US 6,558,882 B2
(45) Date of Patent: May 6, 2003

(54) LASER WORKING METHOD

(75) Inventor: Jun Koide, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 180 days.

(21) Appl. No.: 09/771,885

(22) Filed: Jan. 30, 2001

(65) Prior Publication Data

US 2001/0023052 A1 Sep. 20, 2001

(30) Foreign Application Priority Data

Feb. 3, 2000 (JP) ....................................... 2000-025951

(51) Int. Cl.[7] ........................ H01L 21/027; G03B 27/32; G03B 27/72; B41J 3/04

(52) U.S. Cl. .................. 430/397; 430/945; 219/121.69; 219/121.71

(58) Field of Search ................................ 430/396, 397, 430/945; 219/121.69, 121.71, 121.72, 121.85; 349/2, 4

(56) References Cited

U.S. PATENT DOCUMENTS 4,818,835 A * 4/1989 Kuwabara et al. ........ 219/121.6
5,747,772 A * 5/1998 Matsumura et al. ... 219/121.85
5,821,497 A * 10/1998 Yamazaki et al. ..... 219/121.69

FOREIGN PATENT DOCUMENTS

JP 9-174273 A * 7/1997

* cited by examiner

*Primary Examiner*—John A. McPherson
(74) *Attorney, Agent, or Firm*—Fitzpatrick, Cella, Harper & Scinto

(57) ABSTRACT

An exposure apparatus for exposing an object of exposure to a pattern of a mask by reduction projection with a projection lens utilizing light from a light source, comprising a mask fixed to the optical axis, means for dynamically moving the pattern and means for moving the object of exposure, wherein the exposure is moved in synchronization with the movement of the pattern displayed by the mask.

11 Claims, 2 Drawing Sheets

LASER WORKING METHOD

BACKGROUND OF THE INVENTION

1. Field of the Invention

The present invention relates to an exposure apparatus and a laser working method in which an object to be exposed is irradiated with light through a mask capable of dynamically controlling pattern.

It also relates to a fine working method for a complex material and a complex shape, such as a micromachine, an IC or a hybrid IC device.

2. Related Background Art

Conventionally, the mask used for projecting a light pattern onto an object to be exposed has been composed of a metal plate in which a pattern is formed by electroforming or a glass plate such as of quartz on which a metal film such as of chromium is patterned.

However, such conventional pattern, being composed of a fixed mask or mask pattern which is static and unchangeable, has a limitation in the range of pattern projection depending on the limitation in size of the mask or of the optical system used for projecting the mask pattern. For example, with a mask of 8 inches square and an absolute projecting magnification of ⅕, there can only be exposed an area of about 40 mm square by the projection of the pattern of the entire mask.

Also in case of a projecting magnification of 1/1, there can be exposed an area of 8 inches square at maximum, the precision of the mask pattern itself is directly projected and cannot, therefore, be improved on the projected image. This is because, in case of reduction projection, the precision of the pattern of the projected image is improved according to the projection magnification. Also, an exposure area of 8 inches square need not necessarily be sufficiently large.

SUMMARY OF THE INVENTION

In consideration of the foregoing, the object of the present invention is to provide an exposure apparatus and a laser working method capable of executing exposure on a large area, without limitation in the area of pattern projection by the size of the mask or of the optical system used for projection the mask pattern.

The above-mentioned object can be attained, according to the present invention, by an exposure apparatus and a laser working method constructed as in the following configurations (1) to (16):

(1) An exposure apparatus for exposing an object of exposure to a pattern of a mask by reduction projection with a projection lens utilizing light from a light source, comprising a mask fixed to the optical axis, means for dynamically moving the pattern and means for moving the object of exposure, wherein the exposure is executed while the object of exposure is moved in synchronization with the movement of the pattern displayed by the mask.

(2) An exposure apparatus according to (1), wherein the means for moving the object of exposure is means for moving the object of exposure in a plane perpendicular to the optical axis in synchronization with the movement of the pattern displayed by the mask.

(3) An exposure apparatus according to (1), wherein the means for dynamically moving the pattern of the mask is a light transmitting mask composed of a liquid crystal device capable of dynamically controlling the pattern.

(4) An exposure apparatus according to (1), wherein the light from the light source is linearly polarized light, and the polarizing filter employed in the liquid crystal device is composed only of a single light emitting polarizing filter perpendicular or parallel to the polarizing direction of the incident light, according to the setting of negative or positive transmission.

(5) An exposure apparatus according to (1), wherein the light from the light source is laser light from a laser oscillator which executes continuous emission of light pulses of a large energy density in space and time, with a pulse emission time not exceeding 1 picosecond.

(6) An exposure apparatus according to (5), wherein the laser oscillator is provided with a space compression device for the light propagation.

(7) An exposure apparatus according to (1) or (6), wherein the space compression device for the light propagation includes means for generating a chirped pulse and vertical mode synchronization means utilizing light wavelength dispersion characteristics.

(8) A laser working method for working an object of working by reduction projection of a pattern of a mask by a projection lens utilizing light from a laser oscillator, which comprises utilizing a mask fixed to the optical axis, dynamically moving the pattern and working the object of working while the object of working is moved in synchronization with the movement of the pattern displayed by the mask.

(9) A laser working method according to (8), wherein the object of working is worked while the object of working is moved in a plane perpendicular to the optical axis in synchronization with the movement of the pattern displayed by the mask.

(10) A laser working method according to (8), wherein the mask is a light transmitting mask composed of a liquid crystal device capable of dynamically controlling the pattern.

(11) A laser working method according to (8), wherein the laser light entering the mask is linearly polarized light, and the polarizing filter employed in the liquid crystal device is composed only of a single light emitting polarizing filter perpendicular or parallel to the polarizing direction of the incident light, according to the setting of negative or positive transmission.

(12) A laser working method according to (8), wherein the projection magnification of the projection lens projecting the mask does not exceed 1/20 in the absolute value.

(13) A laser working method according to (8), wherein the position of the mask or the object of working is so changed, in synchronization of the progress of working of the object of working, that the focus point of the pattern image of the projected mask is on a position of working in the direction of the optical axis.

(14) A laser working method according to (8), wherein the light from the laser oscillator is laser light from a laser oscillator which executes continuous emission of light pulses of a large energy density in space and time, with a pulse emission time not exceeding 1 picosecond.

(15) A laser working method according to (14), wherein the laser oscillator is provided with a space compression device for the light propagation.

(16) A laser working method according to (14), wherein the space compression device for the light propagation includes means for generating a chirped pulse and vertical mode synchronization means utilizing light wavelength dispersion characteristics.

DESCRIPTION OF THE PREFERRED EMBODIMENTS

Figure 1:
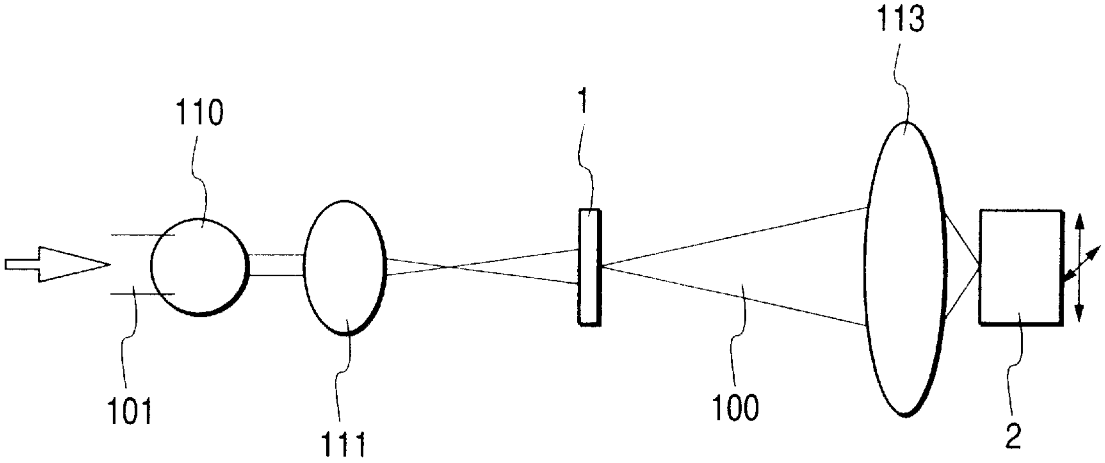
FIG. 1 is a schematic view showing the optical path of a laser working apparatus embodying the present invention.

In an embodiment of the present invention utilizing the above-described configurations, in an exposure apparatus for exposing an object of exposure to a pattern of a mask by projection through a projection lens, a light transmitting mask composed for example of a liquid crystal device is employed as a mask capable dynamically controlling the pattern, and the display pattern of the mask consisting of the liquid crystal device is moved on the image field in synchronization with the movement of the object of exposure in a plane perpendicular to the optical axis whereby the area of the pattern exposed on the object of exposure can be made to depend on the size of the file of the image pattern displayed on the light transmitting mask composed of the liquid crystal device. Thus, there can be realized an exposure apparatus theoretically capable of pattern exposure of a substantially infinite size, if the memory capacity for the image pattern file is enormously large and substantially infinite and if the moving range of stage for moving the object of exposure is also infinite.

Also in a laser working method for working an object of working by reduction projecting a pattern of a mask by a projection lens utilizing light from a laser oscillator, in executing working by dynamically moving the pattern of the mask and moving the object of working in synchronization with the movement of the pattern displayed by the mask, there is employed, as the laser light from the laser oscillator, laser light from a laser oscillator capable of continuously emitting light pulses of a large energy density in space and time with a pulse emission time not exceeding 1 picosecond and a liquid crystal device capable of dynamically controlling the pattern is employed as the mask, whereby the object of working can be ablation worked corresponding to the mask pattern moving in time and can be worked over a wide range. Such laser working method can also be applied for example for forming an ink flow path structure of an ink jet recording head.

The aforementioned laser to be employed in the above-described embodiment is so-called femtosecond laser described for example in the "Summary of Next Generation Optical Technologies" (published by Optronics Co. in 1992; Part 1 Elementary Technologies: Generation and compression of ultra short light pulses, pp. 24–31). Since such femtosecond laser has an extremely large energy density in time and a very short laser light emission time, the sublimation ablation working process can be completed before the laser light is diffused as thermal energy in the object of working, so that the highly precise working can be achieved without deformation of the worked shape by fusion.

For example, a laser oscillator with a pulse emission time not exceeding 150 femtoseconds and an optical energy of 800 microjoule per pulse is already commercially available. Thus the energy density of the emitted laser light reaches a level of about 5.3 gigawatts in the oscillated pulse.

Owing to the characteristics of such laser, the working is easily possible even in the work material of a high thermal conductivity such as metals, ceramics or minerals (such as silicon) because the energy concentration is made possible. Also in material with low optical absorbance such as quartz or glass, the optical energy density reaches a gigawatt level which is more than 100 times of that of the YAG laser, so that the working is rendered possible if there is an optical absorbance of 0.1 to 1% even in glass, quartz or optical crystal.

On the other hand, in the excimer laser which has been employed in the ablation working, it is not possible to use a light transmitting mask based on the liquid crystal device capable of pattern control for dynamically varying the mask pattern, since such laser emits ultraviolet light.

In the following, the present invention will be clarified by an embodiment thereof, with reference to the accompanying drawings.

In the following there will be explained, in detail, an exposure apparatus consisting an embodiment principally featuring the present invention. FIG. 1 is a schematic view showing the optical path of the exposure apparatus of the present invention.

A light beam 101 emitted from an unrepresented light source in a direction indicated by a thick arrow is guided to a zoom beam compressor 110 for conversion into a predetermined light beam diameter, and formed by a mask illuminating lens 111 into a light beam of a predetermined conversion angle, thereby illuminating a mask pattern portion of a liquid crystal mask 1. Then, in a state where a predetermined mask pattern is set in the liquid crystal mask 1, the light transmitted by such mask pattern is projected and focused by a projection lens 113 onto the surface of an object 2 to be exposed, whereby the exposure is initiated.

Figure 2A:
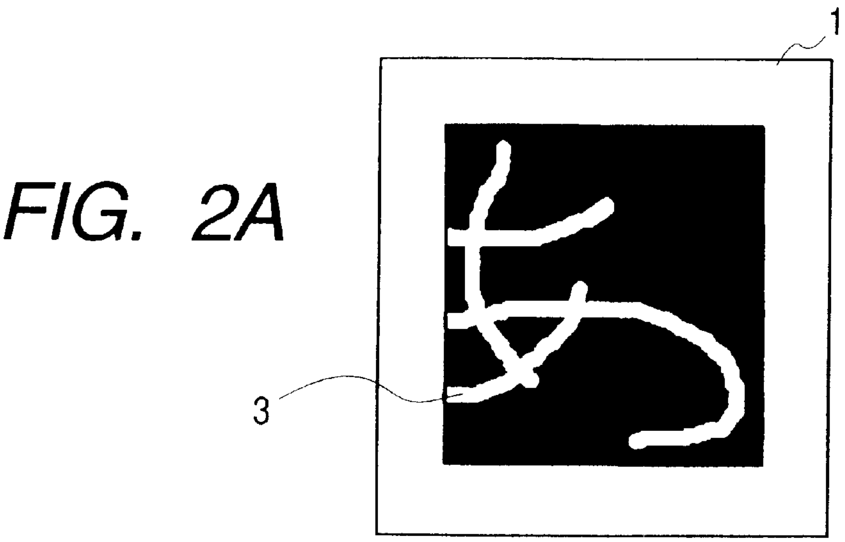
FIGS. 2A, 2B and 2C are schematic views showing the function of a displayed mask pattern of a liquid crystal mask embodying the present invention.
Figure 2B:
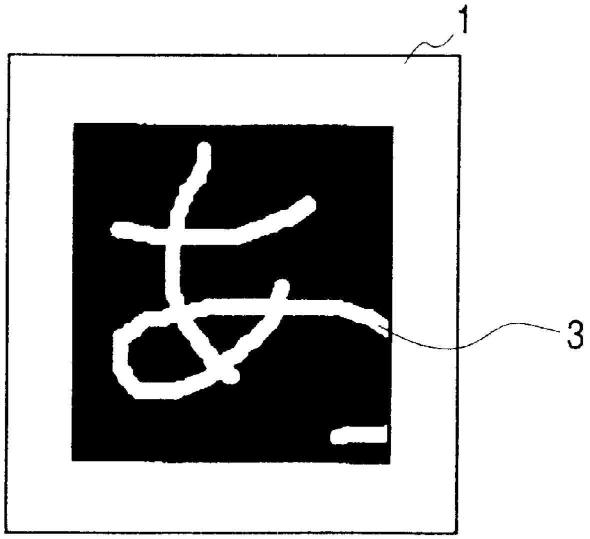
Figure 2C:
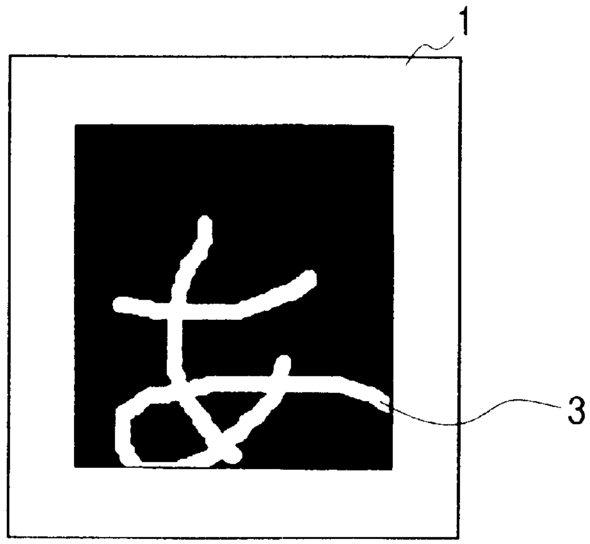

Simultaneous with the light irradiation, the liquid crystal mask is controlled by an unrepresented liquid crystal driver to dynamically move the light transmitting mask pattern 3, displayed on the liquid crystal mask 1, continuously for example in the order shown in FIGS. 2A, 2B and 2C, while the object 2 of exposure is supported by an unrepresented automatically movable mechanical stage and is moved, under the control by an unrepresented stage driver, in synchronization with the movement of the image projected from the mask pattern 3 displayed on the liquid crystal mask 1, whereby the exposure operation proceeds.

Also in case of working with the laser light, the object 2 of exposure is controlled in position by an unrepresented automatic stage, in such a manner that the projected image of the light transmitting mask pattern displayed on the liquid crystal mask is focused at the position of working. The irradiation of the light beam 101 is terminated or the pattern of the liquid crystal mask 1 is controlled to a light non-transmitting state when a predetermined exposure amount is reached or, in case of laser working, when a predetermined working amount is reached, whereby the exposure on the object 2 of exposure is terminated.

According to the present invention, as explained in the foregoing, the object of exposure is exposed under movement in synchronization with the movement of the pattern displayed on the mask, so that the area of the pattern exposed on the object of exposure can be made dependent on the size of the file of the image pattern displayed on the mask. Thus, the pattern exposure can be theoretically realized in an area of a substantially infinite size if the memory capacity of the image pattern file is enormously and practically infinitely large and if the movable range of the stage for moving the object of exposure is practically infinite, and the exposure can be realized in a wide area, without being limited to the area of pattern projection. Also in the laser working method by reduction projection of a mask pattern through a projection lens onto an object of working utilizing the laser light from a laser oscillator, in executing the working operation by dynamically moving the pattern of the mask and also moving the object of working in synchronization with the movement of the pattern displayed by the mask, there is employed a configuration of utilizing, as the aforementioned laser light, the laser light from a laser oscillator capable of continuously emitting light pulses of a large energy density in space and in time with a pulse emission time not exceeding 1 picosecond and also utilizing, as the aforementioned mask, a liquid crystal device capable of dynamically controlling the pattern, thereby executing the ablation working of the object corresponding to the mask pattern moving in time, whereby the object can be worked over a wide area. Also such laser working method can be advantageously applied to the fine working of a complex material and a complex shape such as a micromachine, an IC or a hybrid IC device.

What is claimed is:

1. A laser working method for working an object of working by reduction projection of a pattern of a mask by a projection lens utilizing light from a laser oscillator, which comprises utilizing a mask fixed to the optical axis, dynamically moving said pattern and working said object of working while said object of working is moved in synchronization with the movement of the pattern displayed by said mask.

2. A laser working method according to claim 1, wherein said object of working is worked while said object of working is moved in a plane perpendicular to the optical axis in synchronization with the movement of the pattern displayed by said mask.

3. A laser working method according to claim 2, wherein said mask is a light transmitting mask composed of a liquid crystal device capable of dynamically controlling the pattern.

4. A laser working method according to claim 1, wherein said mask is a light transmitting mask composed of a liquid crystal device capable of dynamically controlling the pattern.

5. A laser working method according to claim 4, wherein the laser light entering said mask is linearly polarized light, and a polarizing filter employed in the liquid crystal device is composed only of a single light emitting polarizing filter perpendicular or parallel to the polarizing direction of said incident light, according to the setting of negative or positive transmission.

6. A laser working method according to claim 1, wherein the projection magnification of the projection lens for projecting said mask does not exceed $1/20$ in the absolute value.

7. A laser working method according to claim 1, wherein the position of the mask or the object of working is so changed, in synchronization of the progress of working of the object of working, that the focus point of the pattern image of said projected mask is on a position of working in the direction of the optical axis.

8. A laser working method according to claim 1, wherein the light from said laser oscillator is laser light from a laser oscillator which executes continuous emission of light pulses of a large energy density in space and time, with a pulse emission time not exceeding 1 picosecond.

9. A laser working method according to claim 8, wherein said laser oscillator is provided with a space compression device for the light propagation.

10. A laser working method according to claim 9, wherein said space compression device for the light propagation includes means for generating a chirped pulse and vertical mode synchronization means utilizing light wavelength dispersion characteristics.

11. A laser working method according to claim 9, wherein said space compression device for the light propagation includes means for generating a chirped pulse and vertical mode synchronization means utilizing light wavelength dispersion characteristics.

* * * * *

UNITED STATES PATENT AND TRADEMARK OFFICE

CERTIFICATE OF CORRECTION

PATENT NO. : 6,558,882 B2
DATED : May 6, 2003
INVENTOR(S) : Jun Koide

It is certified that error appears in the above-identified patent and that said Letters Patent is hereby corrected as shown below:

Column 2,
Line 50, "of" (first occurrence) should read -- with --.

Column 3,
Line 17, "capable" should read -- capable of --.
Line 63, "microjoule" should read -- microjoules --.

Column 6,
Line 14, "of" (first occurrence) should read -- with --.

Signed and Sealed this

Eleventh Day of November, 2003

JAMES E. ROGAN
*Director of the United States Patent and Trademark Office*